United States Patent [19]

Shen et al.

[11] Patent Number: 5,013,675

[45] Date of Patent: May 7, 1991

[54] METHOD OF FORMING AND REMOVING POLYSILICON LIGHTLY DOPED DRAIN SPACERS

[75] Inventors: Lewis Shen; Zahra Hadjizadeh-Amini, both of Cupertino; Hsingya A. Wang, San Jose; James J. Hsu, Saratoga, all of Calif.

[73] Assignee: Advanced Micro Devices, Inc., Sunnyvale, Calif.

[21] Appl. No.: 355,634

[22] Filed: May 23, 1989

[51] Int. Cl.[5] .............. H01L 21/265; H01L 21/4763
[52] U.S. Cl. ..................... 437/44; 437/41; 437/34; 437/56; 437/57; 437/233; 156/625; 156/628
[58] Field of Search ............... 437/34, 40, 41, 44, 437/57, 233, 245, 238; 156/625, 628

[56] References Cited

U.S. PATENT DOCUMENTS

| | | | |
|---|---|---|---|
| 4,383,885 | 5/1983 | Maydan | 156/657 |
| 4,488,351 | 12/1984 | Momase | 437/34 |
| 4,642,878 | 2/1987 | Maeda | 437/44 |
| 4,728,617 | 3/1988 | Woo et al. | 437/44 |
| 4,753,898 | 6/1988 | Parrillo | 437/57 |
| 4,789,426 | 12/1988 | Pipkin | 156/643 |
| 4,818,714 | 4/1989 | Haskell | 437/44 |
| 4,855,247 | 8/1989 | Ma et al. | 437/44 |
| 4,859,620 | 8/1989 | Wei et al. | 437/44 |

FOREIGN PATENT DOCUMENTS 0241267  11/1985  Japan .

OTHER PUBLICATIONS

Wolf et al., Silicon Processing for the VLSI Era, vol. 1, Process Technology, Lattice Press, 1986.
Pfiester, "LDD MOSFET's Using Disposable Sidewall Spacer Technology,"IEEE Electron Device Letters, vol. 9, No. 4, Apr. 1988, pp. 189-192.

Primary Examiner—Olik Chaudhuri
Assistant Examiner—M. Wilczewski
Attorney, Agent, or Firm—Fliesler, Dubb, Meyer & Lovejoy

[57] ABSTRACT

A method of forming and removing spacers used to mask lightly doped drain (LDD) regions in the formation of a field effect transistor (FET) involves depositing a thin oxide layer over the active region of a substrate and a gate structure formed on the active region. A polysilicon film is provided over the oxide and then doped using a $POCl_3$ dopant. The polysilicon layer is then etched to form spacers at the ends of the gate and the spacers are used to mask lightly doped drain regions in the substrate during the implantation of source and drain regions. After the implant to form the source and drain regions, the device is subjected to a rapid thermal annealing for approximately 20-60 seconds at approximately 900° C. in an inert atmosphere to cure any damage to the oxide layer which occurs during the source/drain implant. Curing the oxide layer reduces the etch rate of the oxide layer for an etchant which is designed to selectively etch the polysilicon spacers faster than it etches the oxide layer. The $POCl_3$ doping of the polysilicon layer increases the etch rate of the polysilicon, thus enhancing the selectivity of the etching of the polysilicon versus the oxide layer.

8 Claims, 3 Drawing Sheets

METHOD OF FORMING AND REMOVING POLYSILICON LIGHTLY DOPED DRAIN SPACERS

CROSS-REFERENCE TO RELATED APPLICATION(S)

METHOD OF DETECTING THE WIDTH OF SPACERS AND LIGHTLY DOPED DRAIN REGIONS, Inventors Yow-Juang (Bill) Liu and Zahra Hadjizadeh-Amini, Serial No. 313,984, filed Feb. 22, 1989, assigned to the Assignee of the subject application.

BACKGROUND OF THE INVENTION

1. Field of the Invention

The present invention generally relates to the fabrication of field effect transistors (FETs) having lightly-doped drain (LDD) regions; more particularly, to the formation and removal of LDD spacers.

2. Description of the Related Art

Lightly-doped drain (LDD) regions have commonly been used in reducing the length of the channel region in an FET, thereby reducing the size of transistor. The reduction in the length of the channel region is made possible by LDD regions which separate the source and drain regions from the channel region, and thus increase the channel breakdown voltage and reduce electron impact ionization (hot electron effects) by reducing the electric field at the source and drain pinch-off regions.

An FET having LDD regions is typically fabricated in an active region of a substrate. The active region is bounded by field oxide (FOX) regions which electrically isolate the FET from other devices formed in the same substrate. Conventional processing techniques are utilized to implant regions at both ends of a gate with a light dose of an N/P-type dopant using the gate as a mask. Two $N^-/P^-$ regions formed by the implant define a channel underlying the gate. (Either N-type or P-type dopants may be utilized, and portion of the following discussion which refer only to P-type dopants are for convenience only. In some cases, where either N-or P-type dopants may be used, the dopant type will be noted as N/P. A spacer material layer is formed over the entire structure and etched so that spacers remain at the ends of the gate. These spacers overlie portions of the $N^-/P^-$ regions adjacent to the gate structures. Thereafter, a second implant is performed with a heavier dose of an N/P-type dopant to form $N^+/P^+$ source and drain regions. During the second implant the spacers mask the underlying $N^-/P^-$ regions. The $N^-/P^-$ regions which do not receive the second implant become the LDD regions. Thus, the width of the spacers defines the width of the implanted LDD regions.

The conventional manner of forming spacers is to perform a blanket etch of the spacer material layer. Because there are non-uniformities in the thickness of the spacer material layer, and because of non-uniformities of the etching rate over the entire wafer area, there are areas of the wafer where over-etching occurs and other areas where there is an incomplete removal of the spacer material layer. Conventionally, the spacer material layer is an oxide (usually a CVD oxide), and it is critical that the oxide layer be completely removed from the top of the gate and from the portions of the active region overlying the source and drain regions. However, when the strength of the etchant and the etching time are adjusted to assure complete removal of the oxide from the gate and S/D regions, the etchant often removes material from the field oxide regions. Typically, 1,000–2,000Å of the field oxide is removed. Removal of the field oxide, referred to as oxide loss, reduces the threshold breakdown voltage between the metalization layers and the substrate. Further, oxide loss results in a degradation of device isolation.

Further, it is desirable to select an etching time which provides the proper width of the spacers, rather than basing the etching time on complete removal of the spacer material layer. While the channel breakdown voltage of an LDD FET and its ability to resist hot electron effects can be increased by increasing the width of the LDD regions, the LDD regions can increase the series resistance of the transistor channel and degrade the current drive capability of the FET. Consequently, it is important to control the fabrication process so that an optimum LDD width is achieved.

One proposed method of reducing oxide loss is to form the spacer material layer from a thin layer of thermal oxide, e.g., $SiO_2$, (for protecting the substrate) and a thicker layer of polysilicon overlying the thermal oxide. The polysilicon layer is then etched with an etchant which has a much higher etch rate for polysilicon than for the silicon oxide to form the spacers at the ends of the gate. Because the etchant selectively etches polysilicon, the oxide layer protects the source and drain regions from etching.

If the spacers are formed of an oxide, the spacers may be left in the device—since the oxide is an insulator, the oxide does not disturb the electrical characteristics of the device. Polysilicon is conductive and must be removed before the device is completed. It is, however, very difficult to remove the polysilicon spacers after the $N^+/P^+$ implant since the implant process forms a skin on the surface of the polysilicon; in the case of the P-type dopant boron, the skin is a boron skin. The device must then be exposed to the etchant for a period which is long enough for the etchant to penetrate the skin on the polysilicon spacers, usually a period which allows the etchant to penetrate the oxide layer protecting the source and drain regions and to remove a significant amount of oxide from the FOX regions. After penetrating the protective oxide layer, the etchant will attack the substrate in the source and drain regions, thereby destroying the device being fabricated.

SUMMARY OF THE INVENTION

It is, therefore, an object of the present invention to provide a method of forming and removing LDD spacers which reduces oxide loss.

A further object of the present invention is to provide a method of performing a highly selective etching which removes polysilicon spacers without removing the oxide layer which protects the source and drain regions.

These and other objects of the present invention are accomplished by treating the oxide layer and the polysilicon layer to assure that a highly selective isotropic etching of the polysilicon spacers can be performed to remove the polysilicon spacers. The high selectivity of the etching assures that the etchant will remove the polysilicon spacers without damaging the substrate under the oxide layer or causing oxide loss.

The treatment of the polysilicon layer involves doping the polysilicon to increase its etch rate; this doping is preferably performed before the blanket etch which is used to form the spacers so that the enhanced selectivity provided by the increased etch rate of the polysilicon may be utilized during the formation and the removal of the spacers. The treatment of the oxide layer involves a rapid thermal annealing (RTA) of the oxide layer after implanting the source and drain ($N^+/P^+$) regions through the oxide layer. This implant damages the oxide, increasing the etch rate of the oxide layer and causing the oxide layer to be etched non-uniformly. The RTA process cures the damage to the oxide layer while forming only an extremely thin oxide skin on the polysilicon spacers, thereby redoing the etch rate of the oxide layer and maintaining the ability to etch the spacers more rapidly than the oxide layer.

A method, in accordance with the present invention, of forming and selectively removing structures formed of polysilicon, comprising the steps of (a) providing a substrate, (b) providing a silicon oxide layer on the substrate (c) providing, over the oxide layer, a polysilicon layer which is doped to increase the etch rate of the polysilicon layer for an etchant which etches polysilicon faster than silicon oxide, (d) removing portions of the polysilicon layer to form polysilicon structures, (e) removing the polysilicon structures with the etchant which etches polysilicon faster than silicon oxide.

A method in accordance with the present invention of fabricating a semiconductor device having lightly doped drain regions includes providing a gate on a substrate, implanting lightly doped regions using the gate as a mask, providing an oxide layer overlying the gate and the substrate, providing a polysilicon layer overlying the oxide layer, etching the polysilicon layer to form spacers at the ends of the gate, implanting source and drain regions using the spacers to mask portions of the lightly doped regions, and removing the spacers, by etching, is characterized in that the method includes the steps of doping the polysilicon layer prior to etching the polysilicon layer, and treating the device by rapid thermal annealing after the source and drain regions are implanted and before the spacers are removed.

DESCRIPTION OF THE PREFERRED EMBODIMENTS

The method of the present invention will be described with reference to the formation of an FET. However, the method is applicable to other processes which require selective etching of polysilicon with respect to silicon oxide; for example, processes which are used to form other types of semiconductor devices, including bipolar devices, processes which form other silicon-based structures, and processes used to form miniature motors and/or robots from silicon-based components.

Figure 1:
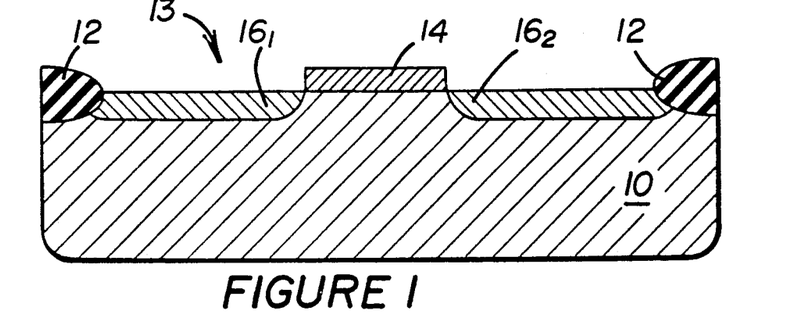
FIGS. 1–4 are partial, sectional views useful for describing the process of the subject invention.

A substrate (a wafer) 10 doped with a background of N-type impurities (e.g., phosphorous) is shown in FIG. 1. As discussed above, the dopants selected are for convenience and the method of the present invention applies to both enhancement mode and depletion mode devices. Using conventional fabrication techniques, field oxide regions 12 are formed on the wafer to define an motive region 13, and a gate structure 14 is formed in active region 13.

A P-type dopant is implanted to form lightly doped regions $16_{1-2}$. The implant dosage is selected so that lightly doped regions $16_{1-2}$ have $P^-$ electrical characteristics. The P-type dopant used to implant LDD lightly doped regions $16_{1-2}$ may be, for example, $B^-$ or $BF_2$, and the implant dosage may be, for example, $10^{14} cm^2$. Portions of lightly doped regions $16_{1-2}$ will become the LDD regions of the FET formed in active region 13.

Figure 2:
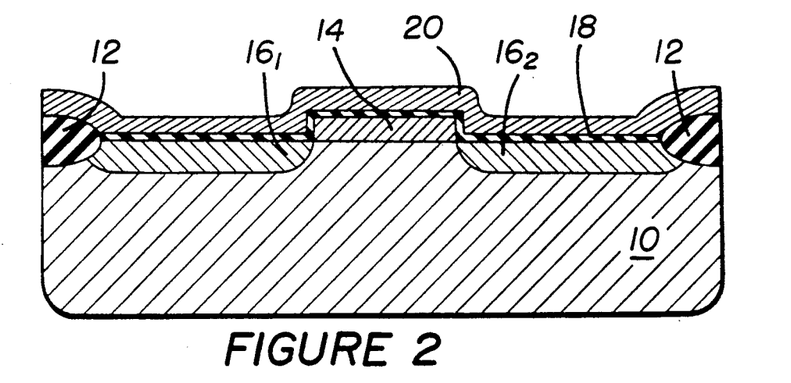

As shown in FIG. 2, a thin etch stop layer 18 (approximately 100–500Å) is formed over the active region 13 of substrate 10 and over gate structure 14. The etch stop layer may be a silicon oxide layer, which in the preferred embodiment is a thermal oxide formed using conventional oxidation techniques. The oxidation process does not form an oxide layer on field oxide regions 12; rather, a small amount of oxide is grown at the interface of field oxide regions 12 and substrate 10.

A spacer material layer 20 is formed over oxide layer 18. The spacer material layer 20 is formed of polysilicon and has a thickness of 500–8000Å. After being deposited, polysilicon layer 20 is doped with an N-type dopant to achieve a resistivity of approximately 20–1000 ohms per square. The method of doping may be ion implantation or vapor phase diffusion. In the preferred embodiment, polysilicon layer 20 is doped in an atmosphere of $POCl_3$ gas at a temperature of approximately 875° C. for approximately 30 minutes. Alternatively, spacer material layer 20 may be deposited as a doped layer by using a gas including $PH_3$ and silane ($SiH_4$) to form a phosphorous doped polysilicon layer by CVD.

Figure 3:
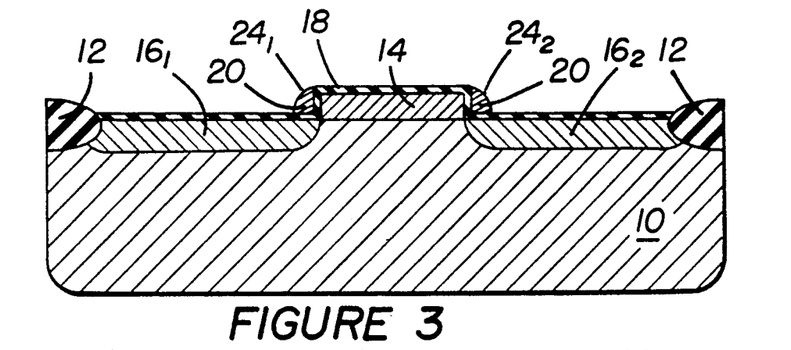

Polysilicon layer 20 is then etched until only spacers $24_{1-2}$ remain at the ends of gate structure 14, shown in FIG. 3. Reactive ion etching (RIE) is one example of an etching process which may be used to etch spacer material layer 20. One method of detecting, and thus controlling, the width of spacers 24 is disclosed in application Ser. No. 313,984, which is hereby incorporated by reference.

Figure 4:
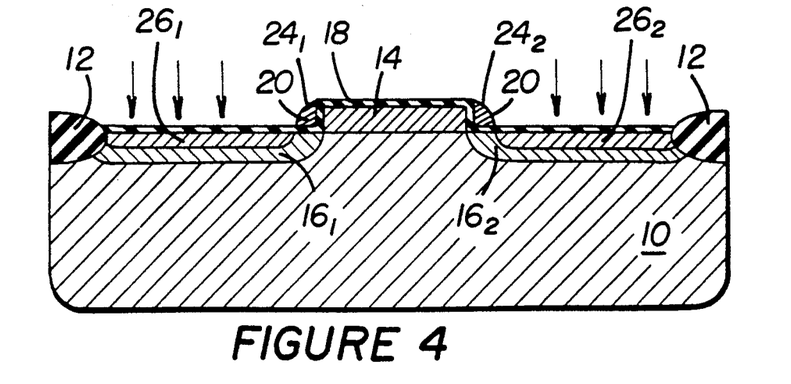

As shown in FIG. 4, after the formation of spacers $24_{1-2}$, an ion implantation is performed to form $P^+$ source and drain regions $26_{1-2}$. The source/drain (S/D) implant is performed in accordance with conventional techniques, well known to those of ordinary skill in the art and may include a diffusion (or activation) of the implanted ions. During the S/D implant, spacers $24_{1-2}$ serve as masks to prevent ion implantation in the portions of lightly doped regions $16_{1-2}$ underlying spacers $24_{1-2}$.

After the S/D implant, it is important to remove all of the remaining polysilicon material, i.e., spacers $24_{1-2}$. Any polysilicon which remains may create leakage currents which would detract from device performance. To remove spacers $24_{1-2}$ it is desirable to perform a high-selectivity etching process which removes the polysilicon portions of spacers $24_{1-2}$ without etching through oxide layer 18. Further, it is desirable that the etching process be isotropic. However, oxide layer 18 is damaged during the S/D implant which penetrates the oxide layer. The damage to the oxide layer increases the etch rate of the oxide layer making it difficult to assure that an etching process which selectively etches polysilicon and not a silicon oxide will have the same selectivity with respect to a damaged oxide of silicon.

To cure (or repair the damage to) oxide layer 18, oxide layer 18 is annealed. In order to prevent oxidation during the annealing process, the anneal is an RTA process performed in an inert (non-oxidizing) atmosphere (nitrogen ($N_2$) or argon (Ar) in the preferred embodiment) for a time of less than approximately 100 seconds (20 seconds in the preferred embodiment) and at a temperature ranging from approximately 600° C. to approximately 1200° C. (900° C. in the preferred embodiment). The time and temperature of the RTA process must be balanced—a low temperature requires a longer processing time, whereas a higher temperature requires a shorter processing time. The RTA process may activate the ions implanted in the S/D implant to form source and drain regions $26_{1-2}$, eliminating the need for a separate activation step.

After the RTA process, an etching process is performed to remove spacers $24_{1-2}$. The etchant is selected for its ability to selectively etch polysilicon at a much faster rate than silicon oxide. One example of such an etchant is a combination of nitric acid, acetic acid, hydrofluoric acid, and iodine. The etchant concentration is optimized to yield an etch time of approximately 30 seconds for control purposes. In particular, it is less advantageous to have a shorter etch time, i.e., a faster etch rate, which makes it more difficult to remove the structure from the etchant before the etchant penetrates oxide layer 18.

The inventors have determined that an S/D implant using boron (in the form of $BF_2$) as a P-type dopant forms a "skin" on the polysilicon portions of spacers $24_{1-2}$. This skin is a boron-rich film which must be penetrated before the etchant can remove the polysilicon. Forming spacers $24_{1-2}$ using polysilicon doped with an N-type dopant has proved to greatly reduce the effects of skin formation on polysilicon portions of spacers $24_{1-2}$ during the boron (in the form of $BF_2$) S/D implant. To achieve the benefits of $POCl_3$ doping, the polysilicon must be doped with $POCl_3$ prior to the S/D implant.

The benefits of doping the polysilicon and of the RTA process have been experimentally demonstrated, and will be discussed with reference to FIGS. 5-8. For all of the experimental results discussed, etching was performed using an etchant comprising 1,300 cc of nitric acid, 100 cc of hydrofluoric acid, 5,600 cc of acetic acid, and 2 gm of iodine, an etchant which has a high selectivity for polysilicon over silicon oxide.

Figure 5:
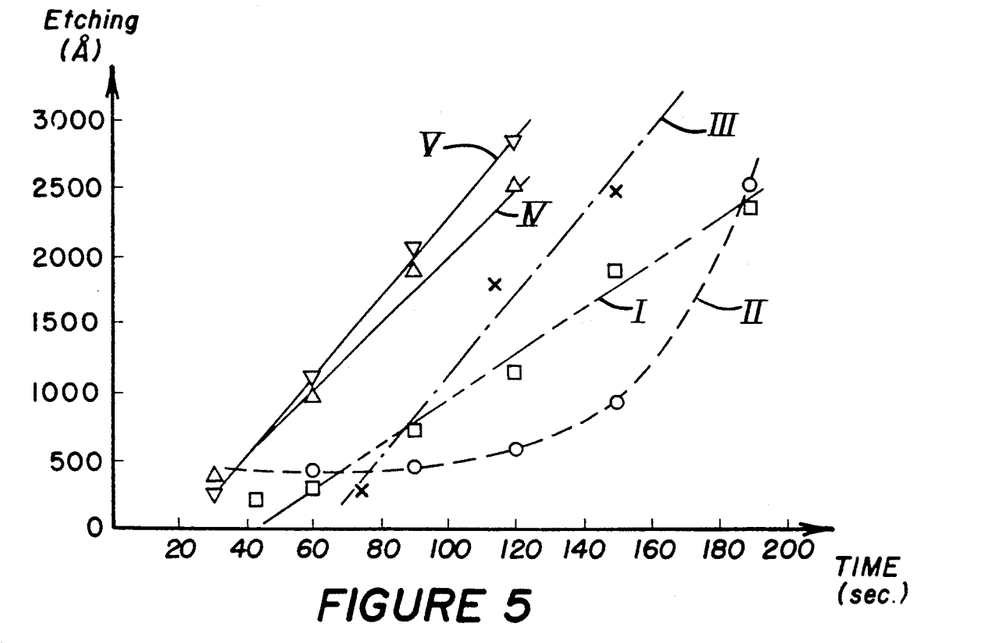
FIGS. 5–8 are graphs useful for describing the beneficial effects of the process of the present invention.

FIG. 5 is a graph having curves 100–500. FIG. 5 demonstrates the benefit of the RTA process of the subject invention. Curve 100 (□) shows the etching rate for a control sample of polysilicon which is not treated after formation, i.e., there is no doping, annealing, or RTA treatment of this sample. The fact that no etching of the polysilicon occurs for 40 seconds indicates that an oxide layer was present on the polysilicon.

Curve 200 (O) shows the etching rate for a polysilicon sample subjected to an ion implantation with $BF_2$, such as the S/D implant used to form source and drain regions $26_{1-2}$. Curve 200 demonstrates that the ion implantation forms a skin on the polysilicon layer and that the etchant does not penetrate this skin for approximately 90 seconds.

Curve 300 (x) shows the etching rate for a polysilicon layer subjected to an S/D implant and then annealed in a furnace tube. An layer formed on the polysilicon layer during the anneal, and thus the etchant did not penetrate the oxide layer for approximately 65 seconds.

Curves 400 (Δ) and 500 (▽) show the etching rates for polysilicon layers which were subjected to an S/D implant (which is the same as the sample used to generate curve 200) and then an RTA process for 20 seconds and 60 seconds, respectively, at 900° C. in a nitrogen ambient. Curves 300, 400 and 500 demonstrate that the annealing improves the etch rate of polysilicon with respect to the control sample of polysilicon and with respect to a non-annealed polysilicon through which an implant was performed. Further, curves 400 and 500 demonstrate that the RTA process forms a very thin oxide skin on the polysilicon layer, and thus etching of the polysilicon commences within 20 seconds of exposure to the etchant.

Figure 6:
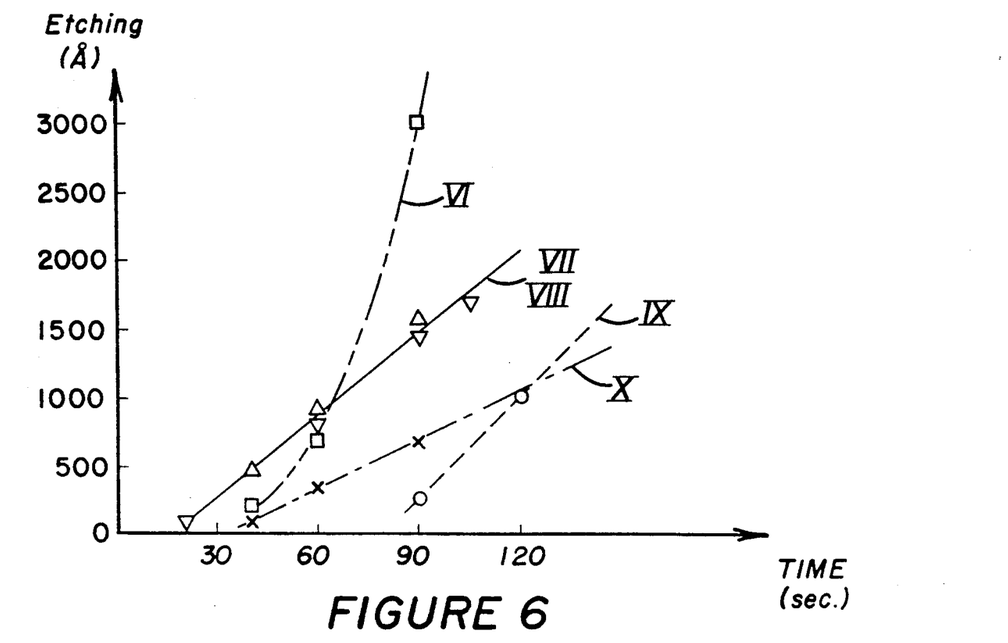

FIG. 6 illustrates the benefits of $POCl_3$ doping of polysilicon layer 20. Curve 600 (□) shows the etch rate for a $POCl_3$ doped polysilicon layer through which a source or drain implant was performed, but which is not treated by annealing or an RTA process. The etch rate shown by curve 600 is greater than 4600Å per minute.

Curves 700 (▽) and 800 (Δ) show the etching rates for polysilicon films which are not doped, through which an implant was performed, and which were subject to an RTA process for 20 seconds and 60 seconds, respectively. The etch rate for curves 700 and 800 is approximately 1,300Å per minute.

Curve 900 (O) shows the etching rate for an undoped polysilicon film through which an implant is performed, and which is annealed for 30 minutes, at a temperature of 900° C., in an argon atmosphere in a furnace tube. The etching rate for curve 900 is approximately 1,500Å per minute, and the anneal process formed an oxide skin on the polysilicon which prevented etching of the polysilicon for approximately 90 seconds.

Curve 1000 (x) shows that the etching rate for a polysilicon layer which is undoped and which is not subjected to an implant or an annealing process is approximately 800Å per minute. The etching rate of $POCl_3$ doped polysilicon is more than 3.5 times greater than undoped polysilicon.

Figure 7:
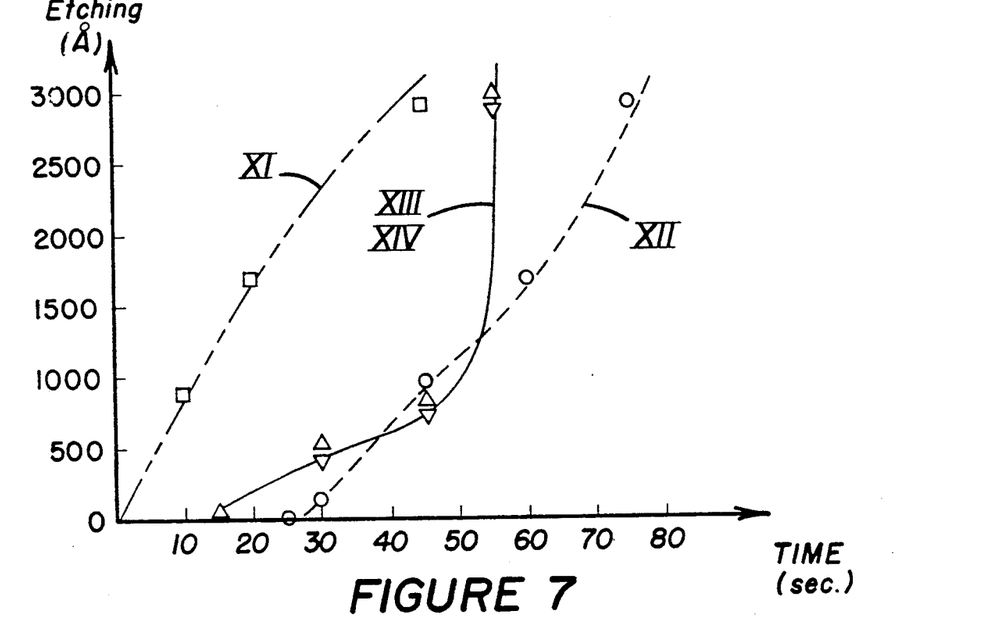

FIG. 7 shows the etching rates for four $POCl_3$ doped polysilicon films. Curve 1100 (□) relates to a $POCl_3$ doped control sample. Curve 1200 (O) relates to a $POCl_3$ doped polysilicon film which was subjected to a S/D implant. Curves 1300 (Δ) and 1400 (▽) relate to $POCl_3$ doped polysilicon films which were subjected to an implant and an RTA process of 20 seconds and 60 seconds, respectively.

Figure 8:
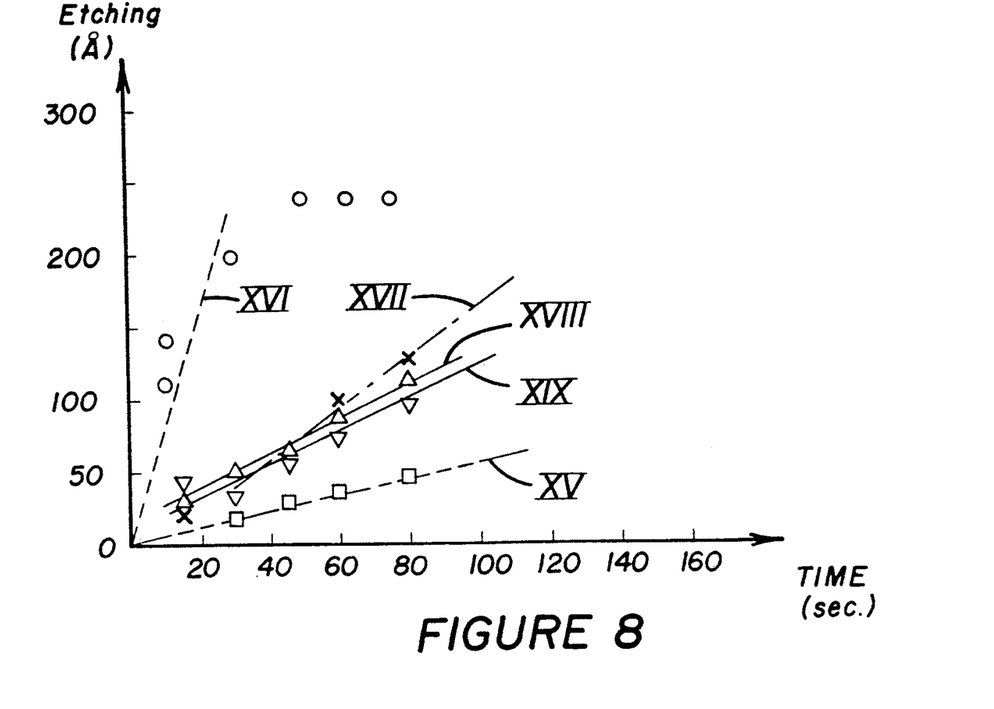

FIG. 8 demonstrates the benefits of the RTA process for curing an oxide layer damaged by the S/D implant. Curve 1500 (□) shows the etching rate for a control sample of plain oxide. Curve 1600 (O) shows that the etching rate for an oxide which is subjected to a S/D implant is much higher than that of the control sample. The etching rate for an oxide subjected to an S/D implant and then annealed is shown by curve 1700 (x), and the etching rates for oxide samples which are subjected to a source/drain implant and then an RTA process for 20 seconds and 60 seconds, respectively, are shown by curves 1800 (Δ) and 1900 (▽). Clearly, the etch rate for the RTA processed, implanted oxides is lower than the etch rate for the non-cured (non-RTA processed) implanted oxide, and thus the etching selectivity for polysilicon versus the oxide is enhanced by the RTA treatment.

The following table will be useful to understand how the experimental results demonstrate the benefits of the present invention.

| Curve # | POCl₃ | Implant | Anneal | RTA |
|---------|-------|---------|--------|-----|
| I, X | No | No | No | No |
| II | No | Yes | No | No |
| III, IX | No | Yes | Yes | No |
| IV, VII | No | Yes | No | Yes |
| V, VIII | No | Yes | No | Yes |
| VI, XII | Yes | Yes | No | No |
| XI | Yes | No | No | No |
| XIII, XIV | Yes | Yes | No | Yes |

A comparison of curves 200 versus curve 600 and of curve 100 versus curve 1100 shows the benefits of the POCl₃ doping. Etching of the POCl₃ doped polysilicon began much sooner than etching of the undoped polysilicon, indicating that the boron skin on the polysilicon is much thinner for a POCl₃ doped polysilicon. Further, the etch rate of a POCl₃ doped polysilicon is much larger than the etch rate of undoped polysilicon.

Comparing curves 400 and 500 versus curves 1300 and 1400 demonstrates that the POCl₃ doping increases the etch rate of the polysilicon.

The many features and advantages of the method of the present invention will be apparent to those skilled in the art from the specification. The following claims are intended to cover all modifications and equivalents falling within the scope of the method of the invention.

What is claimed is:

1. A method of fabricating a semiconductor device having lightly doped drain regions by providing a gate on a portion of a substrate having an N-type background doping, implanting lightly doped regions using the gate as a mask, providing an oxide layer overlying the gate and the substrate, providing a polysilicon layer overlying the oxide layer, etching the polysilicon layer to form spacers at the ends of the gate, implanting P-type dopant ions through the oxide layer using the spacers to mask portions of the lightly doped regions to form source and drain regions, removing the spacers by etching, and activating the source and drain implant, characterized in that the method includes the steps of:
    (a) doping the polysilicon layer with an N-type dopant prior to etching the polysilicon layer to form the spacers; and
    (b) treating the device by rapid thermal annealing to cure defects in the oxide layer after the source and drain regions are implanted, and before the spacers are removed.

2. A method according to claim 1, further characterized in that step (a) comprises doping the polysilicon layer using POCl₃ gas.

3. A method according to claim 1, further characterized in that step (b) comprises annealing for approximately 10–100 seconds at a temperature of approximately 600–1200° C. in an inert atmosphere.

4. A method of forming a semiconductor device having lightly doped drain regions, comprising the steps of:
    (a) providing a substrate having an N-type background doping and an active region;
    (b) providing a gate on a portion of the active region;
    (c) providing a layer of silicon oxide over the active region and the gate;
    (d) providing a polysilicon layer having an N-type doping over the silicon oxide layer;
    (e) etching the polysilicon layer to form spacers utilizing an etchant which etches polysilicon faster than silicon oxide, after said step (d);
    (f) introducing P-type dopant ions into the substrate through the oxide layer to form source and drain regions;
    (g) rapid thermally annealing the device after said step (f) to cure defects in the oxide layer;
    (h) removing the spacers with an etchant which etches polysilicon faster than silicon oxide, after said step (g); and
    (i) annealing the device to activate the P-type dopant ions implanted in said step (f).

5. A method of forming a semiconductor device having lightly doped drain regions, comprising the steps of:
    (a) providing a substrate having an N-type background doping and an active region;
    (b) providing a gate on a portion of the active region;
    (c) providing a layer of silicon oxide over the active region and the gate;
    (d) providing a polysilicon layer over the silicon oxide layer;
    (e) doping the polysilicon layer with N-type dopant ions to increase the etch rate of the polysilicon layer for an etchant which etches polysilicon faster than silicon oxide;
    (f) etching the polysilicon layer to form spacers utilizing an etchant which etches polysilicon faster than silicon oxide;
    (g) implanting P-type dopant ions through the oxide layer to form source and drain regions;
    (h) rapid thermally annealing the device after said step (g) to cure defects in the oxide layer without activating the P-type dopants implanted in said step (g);
    (i) removing the spacers with an etchant which etches polysilicon faster than silicon oxide, after said step (h); and
    (j) annealing the device to activate the P-type dopant ions implanted in said step (g).

6. A method according to claim 5, wherein said step (e) comprises doping the polysilicon layer using POCl₃ gas.

7. A method according to claim 5, wherein said step (h) comprises annealing for approximately 10–100 seconds at a temperature of approximately 600–1200° C. in an inert atmosphere.

8. A method of fabricating a field effect transistor (FET) having lightly doped drain regions, comprising the sequential steps of:
    (a) providing a substrate having an N-type background doping and an active region defined by field oxide regions;
    (b) providing a gate on a first portion of the active region;
    (c) implanting P-type lightly doped regions in the active region using the gate as a mask;
    (d) providing a silicon oxide layer overlying the active region and the gate;
    (e) providing a polysilicon layer over the oxide layer;
    (f) doping the polysilicon layer using POCl₃ gas to increase the etch rate of the polysilicon for an etchant which etches the polysilicon faster than silicon oxide;
    (g) etching the polysilicon layer to form spacers at the edges of the gate using an etchant which etches polysilicon faster than silicon oxide;
    (h) implanting P-type dopants in respective ones of the lightly doped drain regions through the oxide layer using the spacers as masks to form source and drain regions, thereby forming a Boron skin on the polysilicon spacers;
    (i) rapid thermally annealing the FET is a non-oxidizing atmosphere to reduce the etch rate of the oxide layer; and
    (j) removing the spacers using an etchant comprising nitric acid, hydrofluoric acid, acetic and iodines.

* * * * *

UNITED STATES PATENT AND TRADEMARK OFFICE
CERTIFICATE OF CORRECTION

PATENT NO. : 5,013,675

DATED : May 7, 1991

INVENTOR(S) : Lewis Shen; Zahra Hadjizadeh-Amini; Hsingya A. Wang; James J. Hsu

It is certified that error appears in the above-identified patent and that said Letters Patent is hereby corrected as shown below:

The sheets of Drawings consisting of figs. 5-8, should be deleted to appear as per attached sheets.

Signed and Sealed this

Twelfth Day of January, 1993

Attest:

DOUGLAS B. COMER

*Attesting Officer*   Acting Commissioner of Patents and Trademarks